US012581937B2

(12) United States Patent
Yong et al.

(10) Patent No.: US 12,581,937 B2
(45) Date of Patent: Mar. 17, 2026

(54) INTEGRATED DEVICE COMPRISING METALLIZATION INTERCONNECTS

(71) Applicant: RF360 Singapore Pte. Ltd., Singapore (SG)

(72) Inventors: Poh Hoong Yong, Johor Bahru (MY); Siew Li Poh, Singapore (SG); Ren Bin Yang, Singapore (SG); Shan Chen, Singapore (SG)

(73) Assignee: RF360 SINGAPORE PTE. LTD., Singapore (SG)

( * ) Notice: Subject to any disclaimer, the term of this patent is extended or adjusted under 35 U.S.C. 154(b) by 385 days.

(21) Appl. No.: 18/346,701

(22) Filed: Jul. 3, 2023

(65) Prior Publication Data

US 2025/0015024 A1     Jan. 9, 2025

(51) Int. Cl.
H01L 23/00 (2006.01)
H01L 23/522 (2006.01)

(52) U.S. Cl.
CPC .......... H01L 24/05 (2013.01); H01L 23/5226 (2013.01); H01L 24/03 (2013.01); H01L 24/13 (2013.01); *H01L 24/11* (2013.01); *H01L 2224/0346* (2013.01); *H01L 2224/0401* (2013.01); *H01L 2224/05083* (2013.01); *H01L 2224/05124* (2013.01); *H01L 2224/05147* (2013.01); *H01L 2224/05155* (2013.01); *H01L 2224/05166* (2013.01); *H01L 2224/05573* (2013.01); *H01L 2224/05644* (2013.01); *H01L 2224/11849* (2013.01); *H01L 2224/131* (2013.01)

(58) Field of Classification Search
CPC ..... H01L 24/05; H01L 23/5226; H01L 24/03; H01L 24/13; H01L 24/11; H01L 2224/0346; H01L 2224/0401; H01L 2224/05083; H01L 2224/05573; H01L 2224/11849; H01L 2224/131; H01L 2224/02311; H01L 2224/02331; H01L 2224/02371; H01L 2224/0347; H01L 2224/03831; H01L 2224/05008; H01L 2224/05551; H01L 2224/05566; H01L 2224/05569
See application file for complete search history.

(56) References Cited

U.S. PATENT DOCUMENTS 6,645,853 B1 * 11/2003 Ngo .................. H01L 23/53238
                                                   257/E23.145
9,082,762 B2 * 7/2015 Kang ...................... H01L 24/81
11,894,829 B2 * 2/2024 Steinhaeusser ........ H10N 30/06
12,125,742 B2 * 10/2024 Cho ...................... H01L 21/486
2008/0150161 A1 * 6/2008 Lin ......................... H01L 24/13
                                                   257/E23.141

(Continued)

OTHER PUBLICATIONS

International Search Report and Written Opinion—PCT/SG2024/050411—ISA/EPO—Sep. 30, 2024.

*Primary Examiner* — Douglas W Owens
(74) *Attorney, Agent, or Firm* — Loza & Loza, LLP

(57) ABSTRACT

An integrated device comprising a die substrate; a die interconnection portion coupled to the die substrate; and a metallization interconnect coupled to the die interconnection portion. The metallization interconnect comprises an adhesion metal layer, a first metal layer coupled to the adhesion metal layer; a second metal layer coupled to the first metal layer, and a third metal layer coupled to the second metal layer.

22 Claims, 16 Drawing Sheets

*CROSS SECTIONAL SIDE PROFILE VIEW*

(56) References Cited

U.S. PATENT DOCUMENTS

| | | | |
|---|---|---|---|
| 2014/0327139 A1* | 11/2014 | Yu | H01L 23/485 |
| | | | 438/653 |
| 2014/0339699 A1* | 11/2014 | Arvin | H01L 21/76885 |
| | | | 257/738 |
| 2017/0062344 A1* | 3/2017 | Liu | H01L 21/76843 |
| 2021/0257293 A1* | 8/2021 | Lee | H01L 21/76829 |

\* cited by examiner

CROSS SECTIONAL SIDE PROFILE VIEW

CROSS SECTIONAL SIDE PROFILE VIEW

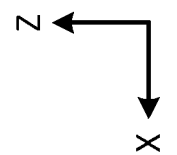
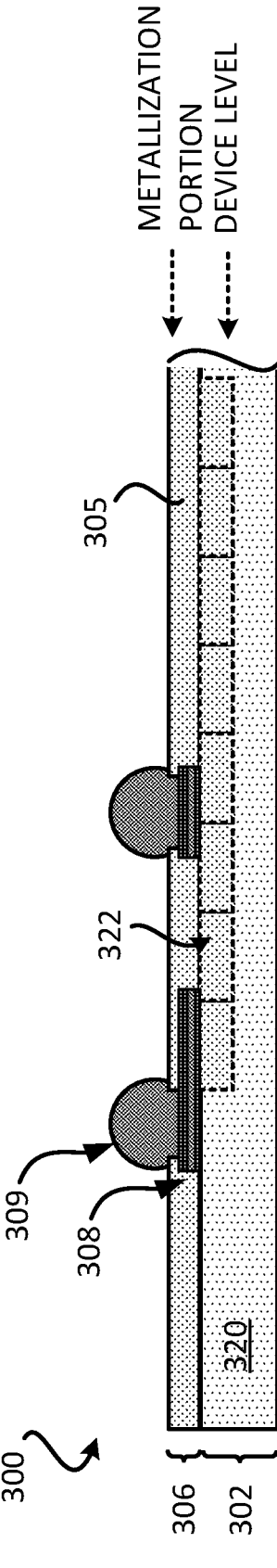
*CROSS SECTIONAL SIDE PROFILE VIEW*
*FIG. 3*

CROSS SECTIONAL SIDE PROFILE VIEW

DIE

PHOTORESIST FORMATION

ADHESION METAL LAYER + METAL LAYER FORMATION

METAL LAYER
FORMATION

140

500

284

282

142

METAL LAYER
FORMATION

PHOTORESIST
REMOVAL

PHOTORESIST
FORMATION

METAL LAYER
REMOVAL

PHOTORESIST
REMOVAL

520

140

142

108b

108a

142

140

108

⑧

⑨

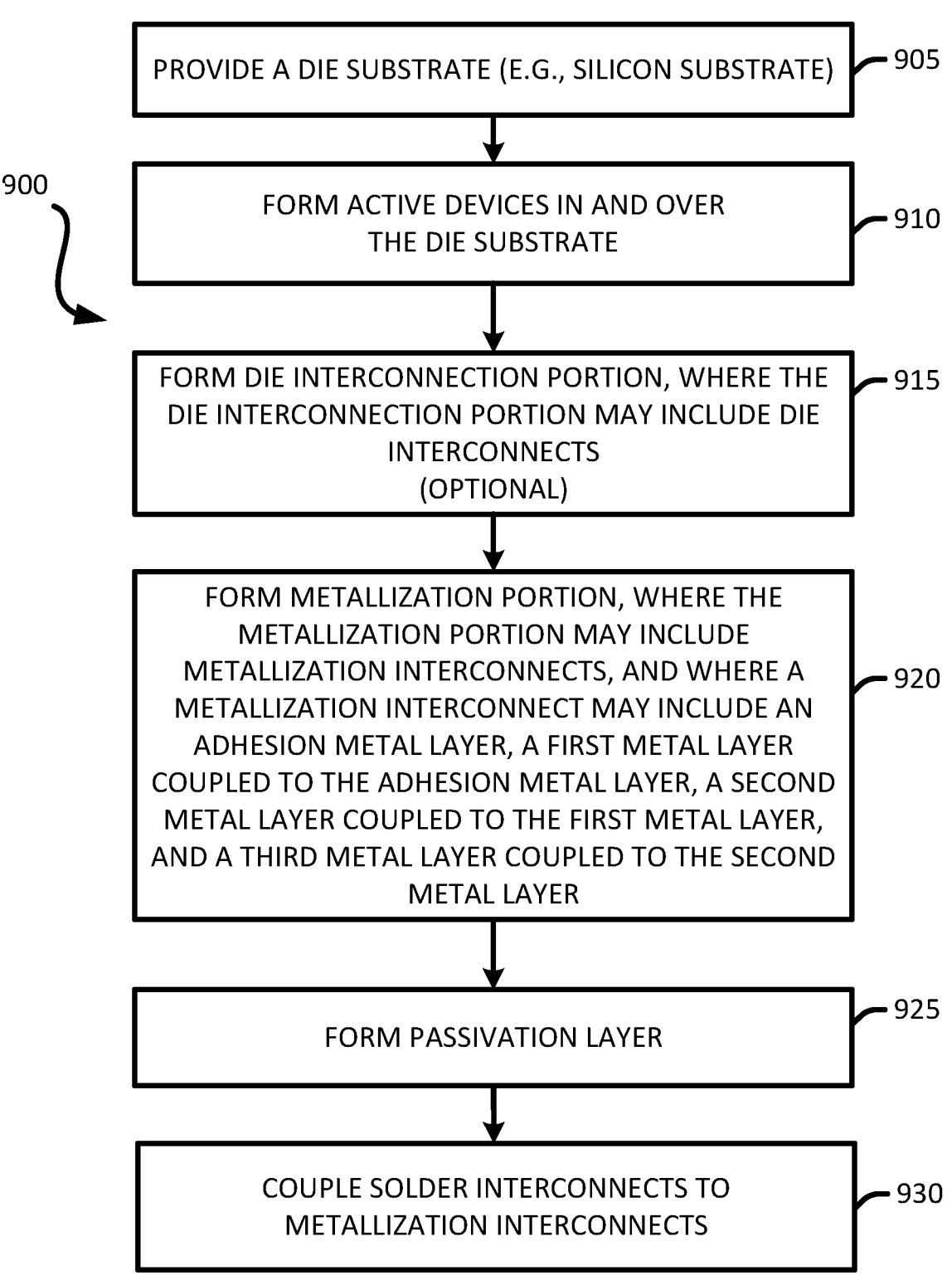

PROVIDE A DIE SUBSTRATE (E.G., SILICON SUBSTRATE) ⟋ 905

FORM ACTIVE DEVICES IN AND OVER
THE DIE SUBSTRATE ⟋ 910

FORM DIE INTERCONNECTION PORTION, WHERE THE
DIE INTERCONNECTION PORTION MAY INCLUDE DIE
INTERCONNECTS
(OPTIONAL) ⟋ 915

FORM METALLIZATION PORTION, WHERE THE
METALLIZATION PORTION MAY INCLUDE
METALLIZATION INTERCONNECTS, AND WHERE A
METALLIZATION INTERCONNECT MAY INCLUDE AN
ADHESION METAL LAYER, A FIRST METAL LAYER
COUPLED TO THE ADHESION METAL LAYER, A SECOND
METAL LAYER COUPLED TO THE FIRST METAL LAYER,
AND A THIRD METAL LAYER COUPLED TO THE SECOND
METAL LAYER ⟋ 920

FORM PASSIVATION LAYER ⟋ 925

COUPLE SOLDER INTERCONNECTS TO
METALLIZATION INTERCONNECTS ⟋ 930

INTEGRATED DEVICE COMPRISING METALLIZATION INTERCONNECTS

FIELD

Various features relate to integrated devices.

BACKGROUND

A package may include a substrate and integrated devices. These components are coupled together to provide a package that may perform various functions. The performance of a package and its components may depend on how these components are configured together. Interconnects are an important part of an integrated device. There is an ongoing need to provide integrated devices with reliable interconnects and interconnects with low resistance, which can result in interconnects with improved electrical conductivity.

SUMMARY

Various Features Relate to Integrated Devices

One example provides an integrated device comprising a die substrate; a die interconnection portion coupled to the die substrate; and a metallization interconnect coupled to the die interconnection portion. The metallization interconnect comprises an adhesion metal layer; a first metal layer coupled to the adhesion metal layer; a second metal layer coupled to the first metal layer; and a third metal layer coupled to the second metal layer.

One example provides an integrated device comprising a die substrate; and a metallization interconnect coupled to the die substrate. The metallization interconnect comprises an adhesion metal layer; a first metal layer coupled to the adhesion metal layer; a second metal layer coupled to the first metal layer; and a third metal layer coupled to the second metal layer.

Another example provides a method for fabricating an integrated device. The method provides a die substrate. The method forms a metallization interconnect. The metallization interconnect comprises an adhesion metal layer; a first metal layer coupled to the adhesion metal layer; a second metal layer coupled to the first metal layer; and a third metal layer coupled to the second metal layer.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a profile cross sectional view of another exemplary integrated device.

FIGS. 5A-5F illustrate an exemplary sequence for fabricating an integrated device.

FIG. 9 illustrates an exemplary flow diagram of a method for fabricating an integrated device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device comprising a die substrate; a die interconnection portion coupled to the die substrate; and a metallization interconnect coupled to the die interconnection portion. The metallization interconnect comprises an adhesion metal layer; a first metal layer coupled to the adhesion metal layer; a second metal layer coupled to the first metal layer; and a third metal layer coupled to the second metal layer. The die interconnection portion may be optional. The metallization interconnect may represent a metallization interconnect and an under bump metallization interconnect. As will be further described below, the metallization interconnect may be fabricated using less metal layers and less steps than other fabrication processes that require more steps and more metal layers. This may reduce costs, provide lower electrical resistances for the plurality of metallization interconnects (thus better electrical conductivity) and/or reduced delamination risks of one or more metal layers.

Exemplary Integrated Device

Figure 1:
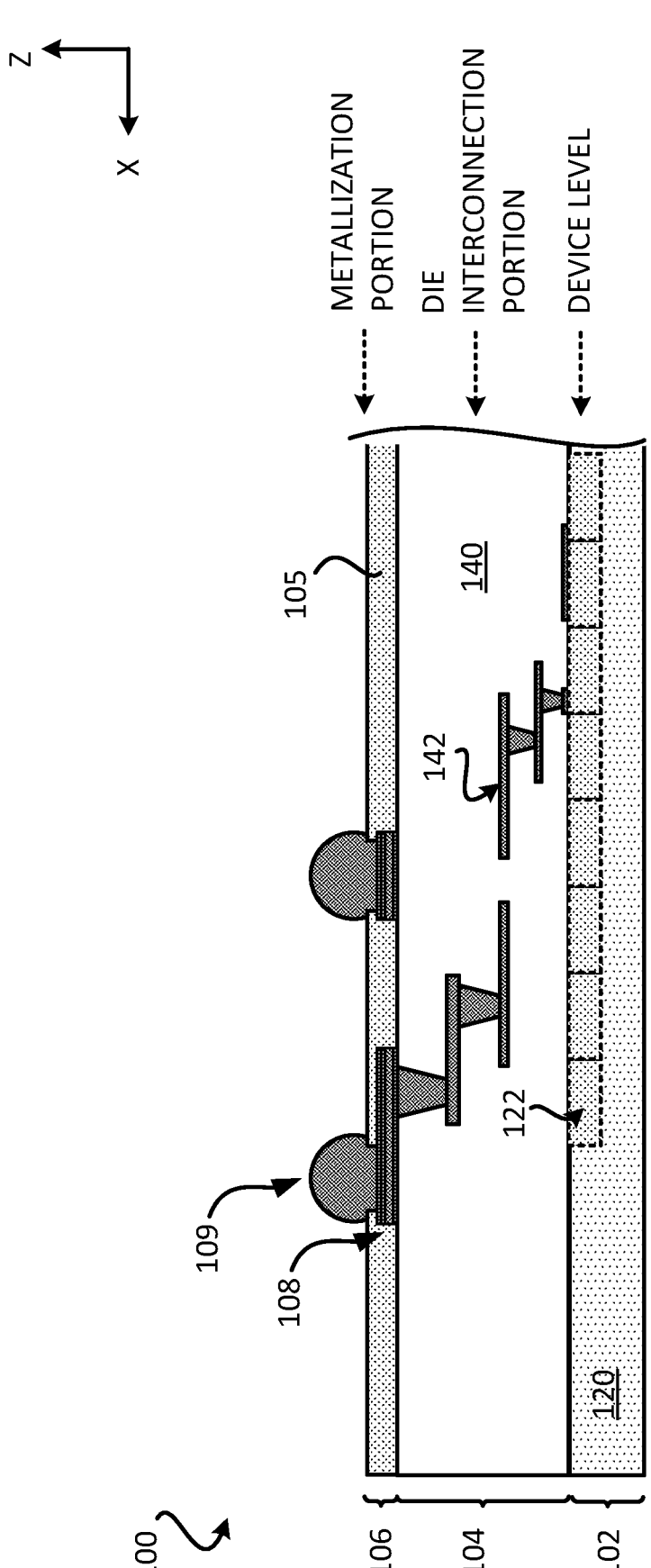
FIG. 1 illustrates a profile cross sectional view of an exemplary integrated device.

FIG. 1 illustrates a cross sectional profile view of an integrated device 100. The integrated device 100 includes a substrate portion 102, a die interconnection portion 104, and a metallization portion 106. A plurality of solder interconnects 109 may be coupled to the metallization portion 106. The integrated device 100 may be coupled to a substrate (e.g., package substrate), an interposer, or a board (e.g., printed circuit board) through the plurality of solder interconnects 109.

The substrate portion 102 includes a die substrate 120. The die substrate 120 may include silicon (Si). A plurality of cells (e.g., logic cells) and/or a plurality of transistors (not shown) may be formed in and/or over the die substrate 120. The plurality of cells (e.g., logic cells) and/or a plurality of transistors (not shown) may be part of a device level 122 of the integrated device 100. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 120. Although not shown, the die substrate 120 may include through substrate vias (e.g., through die substrate vias). Moreover, one or more metal layers (not shown and which may form back side interconnects) may be coupled to the back side of the die substrate 120. These back side interconnects may be coupled to the through substrate vias.

The die interconnection portion 104 is located over and coupled to the die substrate 120. The die interconnection portion 104 may be coupled to the plurality of cells and/or transistors located in and/or over the die substrate 120. The die interconnection portion 104 may be touching the surface and/or side of the die substrate 120 that includes the plurality of cells and/or transistors (e.g., side of die substrate 120 that includes the device level 122). The die interconnection portion 104 may include at least one dielectric layer 140 (e.g., die dielectric layer) and a plurality of die interconnects 142. The plurality of die interconnects 142 may be coupled to the plurality of cells and/or transistors (e.g., coupled to the device level 122). In some implementations, a back end of line (BEOL) process may be used to fabricate the die interconnection portion 104. The passivation layer 105 may be located over the at least one dielectric layer 140. In some implementations, the passivation layer 105 may be considered part of the die interconnection portion 104.

The metallization portion 106 is coupled to the die interconnection portion 104. The metallization portion 106 includes a plurality of metallization interconnects 108. The plurality of metallization interconnects 108 are coupled to the plurality of die interconnects 142. The plurality of solder interconnects 109 may be coupled to the plurality of metallization interconnects 108. In some implementations, the passivation layer 105 may be considered part of the metallization portion 106. In some implementations, a back end of line (BEOL) process may be used to fabricate the metallization portion 106. The plurality of metallization interconnects 108 may include a plurality of redistribution interconnects (e.g., RDL) and/or a plurality of under bump metallization interconnects (e.g., UBM). Thus, in some implementations, a metallization interconnect may represent the combination of a redistribution interconnect and an under bump metallization interconnect. Examples of metallization interconnects include pads and/or traces. The plurality of metallization interconnects 108 may include two or more conductive layers (e.g., two or more metal layers).

Figure 2:
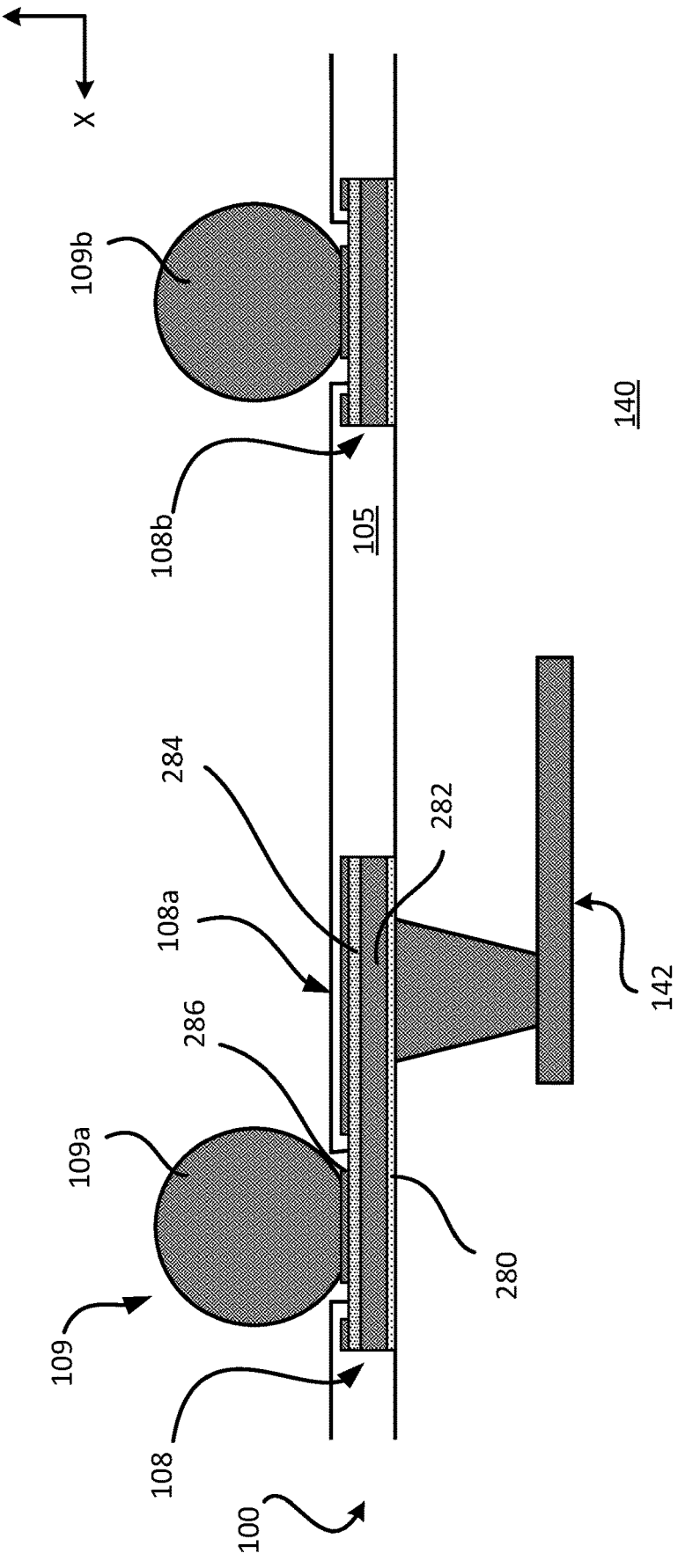
FIG. 2 illustrates a close-up profile cross sectional view of an exemplary integrated device.

FIG. 2 illustrates a close-up view of the integrated device 100 of FIG. 1. As shown in FIG. 2, the integrated device 100 includes at least one dielectric layer 140, the plurality of die interconnects 142, the plurality of metallization interconnects 108 and the passivation layer 105. The plurality of solder interconnects 109 are coupled to the plurality of metallization interconnects 108. The plurality of metallization interconnects 108 include a metallization interconnect 108a (e.g., first metallization interconnect) and a metallization interconnect 108b (e.g., second metallization interconnect). The plurality of solder interconnects 109 include a solder interconnect 109a (e.g., first solder interconnect) and a solder interconnect 109b (e.g., second solder interconnect). The solder interconnect 109a is coupled to the metallization interconnect 108a. The solder interconnect 109b is coupled to the metallization interconnect 108b. The metallization interconnect 108a may be coupled to a die interconnect from the plurality of die interconnects 142. The metallization interconnect 108b may be coupled to another die interconnect from the plurality of die interconnects 142.

As shown in FIG. 2, the plurality of metallization interconnects 108 may be formed and/or defined by several electrically conductive layers (e.g., several metal layers). For example, the metallization interconnect 108a may include an adhesion metal layer 280, a metal layer 282, a metal layer 284 and/or a metal layer 286. The adhesion metal layer 280 may be an adhesion metal layer. The metal layer 284 may be a wetting layer and/or barrier layer. The metal layer 286 may be a protection layer. Similarly, the metallization interconnect 108b may include an adhesion metal layer 280, a metal layer 282, a metal layer 284 and a metal layer 286. The passivation layer 105 may touch at least part of each metal layer that defines a metallization interconnect from the plurality of metallization interconnects 108. For example, the passivation layer 105 may touch the side portions and/or side walls of (i) the adhesion metal layer 280, (ii) the metal layer 282, (iii) the metal layer 284 and/or (iv) the metal layer 286, of one or more metallization interconnects from the plurality of metallization interconnects 108.

In some implementations, the adhesion metal layer 280 may include titanium (Ti). In some implementations, the metal layer 282 may include aluminum (Al) and/or copper (Cu). In some implementations, the metal layer 284 may include copper (Cu) and/or nickel (Ni). In some implementations, the metal layer 286 may include gold (Au). It is noted that different implementations, may include different metals and/or different combinations of metals. The various metal layers (e.g., 280, 282, 284, 286) may have different thicknesses and/or similar thicknesses.

The adhesion metal layer 280 is coupled to and directly touching a die interconnect from the plurality of die interconnects 142. The metal layer 282 is coupled to and directly touching the adhesion metal layer 280. The metal layer 284 is coupled to and directly touching the metal layer 282. The metal layer 286 is coupled to and directly touching the metal layer 284. FIG. 2 illustrates an interconnect (e.g., 108a) between a solder interconnect (e.g., 109a) and a die interconnect from the plurality of die interconnects 142, that is defined by 4 metal layers.

As mentioned above, the plurality of metallization interconnects may be a combination of a metallization interconnect and an under bump metallization interconnect. Thus, a metallization interconnect may represent both a metallization interconnect (e.g., redistribution interconnect) and an under bump metallization interconnect (e.g., UBM interconnect). As will be further described below, the structure of the plurality of metallization interconnects 108 may be fabricated using one lithography process and one metallization process. Once the adhesion metal layer 280, the metal layer 282 and the metal layer 284 are formed, another lithography process and etching process may be performed to form the metal layer 286. The metal layer 286 may be configured to prevent solder (e.g., solder interconnect) from wetting into the a non-bumping area. The metal layer 286 may be patterned using a photoresist layer. Thus, the plurality of metallization interconnects 108 may be fabricated using less metal layers and less steps than other fabrication processes that require more steps and more metal layers. This may reduce costs, provide lower electrical resistances for the plurality of metallization interconnects (thus better electrical conductivity) and/or reduced delamination risks of one or more metal layers. The above advantages are in contrast with other interconnect structures and/or processes that fabricate interconnects and under bump metallization interconnects as separate processes, which requires the cleaning of surfaces between the metallization interconnect and the under bump metallization interconnect.

FIG. 3 illustrates a cross sectional profile view of an integrated device 300. The integrated device 300 includes a substrate portion 302, and a metallization portion 306. The metallization portion 306 is coupled to and touching the substrate portion 302. A plurality of solder interconnects 309 may be coupled to the metallization portion 306. The integrated device 300 may be coupled to a substrate (e.g., package substrate), an interposer, or a board (e.g., printed circuit board) through the plurality of solder interconnects 309. The integrated device 300 may be similar to the integrated device 100. However, the integrated device 300 does not include a die interconnection portion like the one shown for the integrated device 100. The integrated device 300 may be configured as a filter (e.g., SAW filter).

The substrate portion 302 includes a die substrate 320. The die substrate 320 may include silicon (Si). A plurality of filters, a plurality of cells (e.g., logic cells) and/or a plurality of transistors (not shown) may be formed in and/or over the die substrate 320. The plurality of filters, the plurality of cells (e.g., logic cells) and/or the plurality of transistors (not shown) may be part of the device level 322 of the integrated device 300. Different implementations may use different types of transistors, such as a field effect transistor (FET), planar FET, finFET, and a gate all around FET. In some implementations, a front end of line (FEOL) process may be used to fabricate the plurality of filters, the plurality of cells (e.g., logic cells) and/or transistors in and/or over the die substrate 320. Although not shown, the die substrate 320 may include through substrate vias (e.g., through die substrate vias). Moreover, one or more metal layers (not shown and which may form back side interconnects) may be coupled to the back side of the die substrate 320. These back side interconnects may be coupled to the through substrate vias.

The metallization portion 306 is located over and coupled to the die substrate 320. The metallization portion 306 may be touching the die substrate 320. The metallization portion 306 may be coupled to the plurality of filters, the plurality of cells and/or transistors located in and/or over the die substrate 320. The metallization portion 306 includes a plurality of metallization interconnects 308. The plurality of metallization interconnects 308 are coupled to the device level 322 of the integrated device 300. For example, the plurality of metallization interconnects 308 may be coupled to a plurality of filters, a plurality of cells (e.g., logic cells) and/or a plurality of transistors (not shown).

The plurality of solder interconnects 309 may be coupled to the plurality of metallization interconnects 308. The passivation layer 305 may be considered part of the metallization portion 306. In some implementations, a back end of line (BEOL) process may be used to fabricate the metallization portion 306. The plurality of metallization interconnects 308 may include a plurality of redistribution interconnects (e.g., RDL) and/or a plurality of under bump metallization interconnects (e.g., UBM). Examples of metallization interconnects include pads and/or traces. The plurality of metallization interconnects 308 may include two or more conductive layers (e.g., two or more metal layers).

Figure 4:
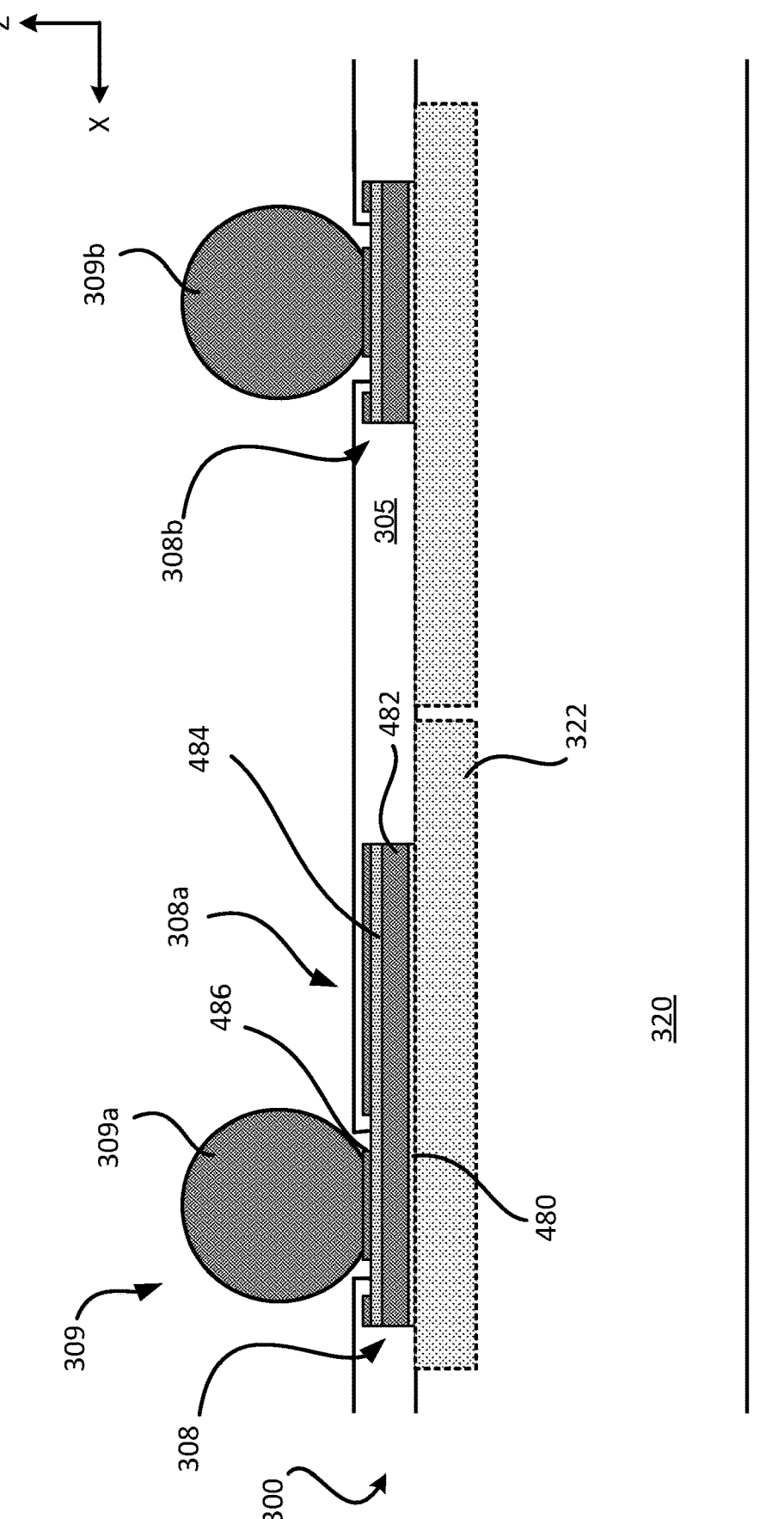
FIG. 4 illustrates a close-up profile cross sectional view of another exemplary integrated device.

FIG. 4 illustrates a close-up view of the integrated device 300 of FIG. 3. As shown in FIG. 4, the integrated device 300 includes a die substrate 320, a device level 322, a plurality of metallization interconnects 308, and a passivation layer 305. The plurality of solder interconnects 309 are coupled to the plurality of metallization interconnects 308. The plurality of metallization interconnects 308 include a metallization interconnect 308a (e.g., first metallization interconnect) and a metallization interconnect 308b (e.g., second metallization interconnect). The plurality of solder interconnects 309 includes a solder interconnect 309a (e.g., first solder interconnect) and a solder interconnect 309b (e.g., second solder interconnect). The solder interconnect 309a is coupled to the metallization interconnect 308a. The solder interconnect 309b is coupled to the metallization interconnect 308b. The metallization interconnect 308a may be coupled to a device level 322 of the integrated device 300. The metallization interconnect 308a may be touching the device level 322 of the integrated device 300. The metallization interconnect 308b may be coupled to a device level 322 of the integrated device 300. The metallization interconnect 308b may be touching the device level 322 of the integrated device 300.

As shown in FIG. 4, the plurality of metallization interconnects 308 may be formed and/or defined by several electrically conductive metal layers (e.g., metal layers). For example, the metallization interconnect 308a may include a metal layer 480, a metal layer 482, a metal layer 484 and/or a metal layer 486. The metal layer 480 may be an adhesion metal layer. The metal layer 484 may be a wetting layer and/or barrier layer. The metal layer 486 may be a protection layer. Similarly, the metallization interconnect 308b may include a metal layer 480, a metal layer 482, a metal layer 484 and a metal layer 486. The passivation layer 305 may touch at least part of each metal layer that defines a metallization interconnect from the plurality of metallization interconnects 308. For example, the passivation layer 305 may touch the side portions and/or side walls of (i) the metal layer 480, (ii) the metal layer 482, (iii) the metal layer 484 and/or (iv) the metal layer 486, of one or more metallization interconnects from the plurality of metallization interconnects 308

In some implementations, the metal layer 480 may include titanium (Ti). In some implementations, the metal layer 482 may include aluminum (Al) and/or copper (Cu). In some implementations, the metal layer 484 may include copper (Cu) and/or nickel (Ni). In some implementations, the metal layer 486 may include gold (Au). It is noted that different implementations, may include different metals and/or different combinations of metals. The various metal layers (e.g., 480, 482, 484, 486) may have different and/or similar thicknesses.

The metal layer 480 may be coupled to and directly touching a device level 322, which may include filters, logic cells and/or transistors. The metal layer 482 is coupled to and directly touching the metal layer 480. The metal layer 484 is coupled to and directly touching the metal layer 482. The metal layer 486 is coupled to and directly touching the metal layer 484. FIG. 4 illustrates an interconnect (e.g., 308a) between a solder interconnect (e.g., 309a) and a device level 322, that is defined by 4 metal layers.

The technical advantages described above for the integrated device 100 may also be applicable to the integrated device 300. For example, the plurality of metallization interconnects 308 may be fabricated using less metal layers and less steps than other fabrication processes that require more steps and more metal layers. This may reduce costs, provide lower electrical resistances for the plurality of metallization interconnects (thus better electrical conductivity) and/or reduced delamination risks of one or more metal layers.

An integrated device (e.g., 100, 300) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 100) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes.

Exemplary Sequence for Fabricating an Integrated Device

FIGS. 5A-5F illustrate an exemplary sequence for providing or fabricating an integrated device. In some implementations, the sequence of FIGS. 5A-5F may be used to provide or fabricate the integrated device 100 of FIG. 1, or any of the integrated devices described in the disclosure. In some implementations, the sequence of FIGS. 5A-5F may be used to provide or fabricate the integrated device 300 of FIG. 3.

It should be noted that the sequence of FIGS. 5A-5F may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. The sequence of FIGS. 5A-5F may be used to fabricate one integrated device or several integrated devices at a time (as part of a wafer).

Figure 5A:
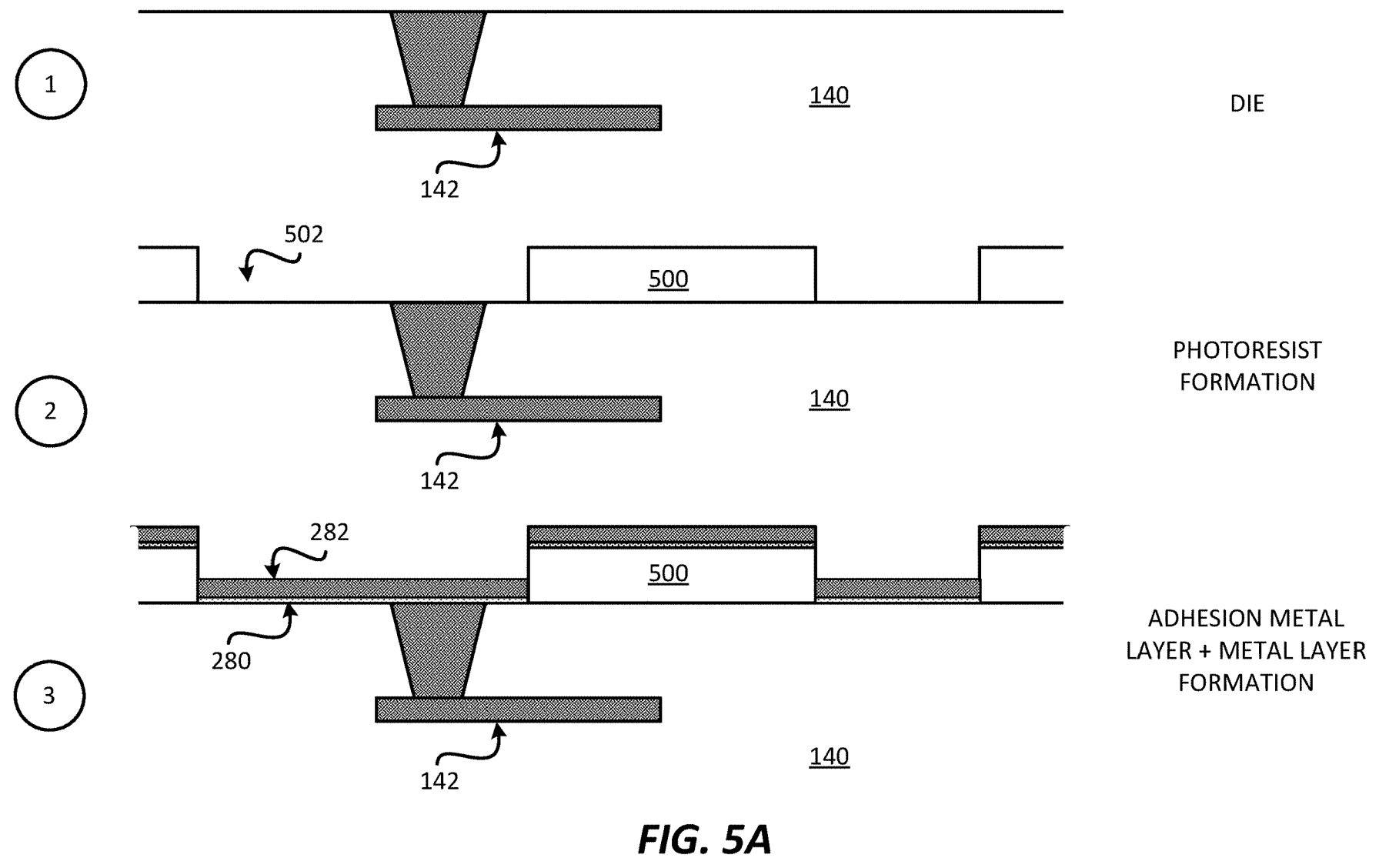

Stage 1, as shown in FIG. 5A, illustrates a state after a substrate portion 102 and a die interconnection portion 104 are provided (e.g., fabricated). The substrate portion 102 may include a die substrate 120 (not shown) and a device level 122 (not shown), which may include a plurality of cells and/or transistors. In some implementations, a front end of line (FEOL) process may be used to fabricate the plurality of cells (e.g., logic cells) and/or transistors in and/or over the die substrate 120. The die interconnection portion 104 includes at least one dielectric layer 140 and a plurality of die interconnects 142. In some implementations, a back end of line (BEOL) process may be used to fabricate the die interconnection portion 104.

Stage 2 illustrates a state after a photoresist layer 500 is formed over the die interconnection portion 104. The photoresist layer 500 may be formed over the at least one dielectric layer 140 and/or the die interconnects 142. The photoresist layer 500 may include a plurality of openings 502. A deposition process may be used to form the photoresist layer 500. A patterning process may be used to form the plurality of openings 522 in the photoresist layer 500. A photoresist layer may be a mask.

Stage 3 illustrates a state after the adhesion metal layer 280 and the metal layer 282 are formed over the die interconnection portion 104. The adhesion metal layer 280 is formed through openings in the photoresist layer 500. The adhesion metal layer 280 may include titanium (Ti). A deposition process (e.g., plating) may be used to form the adhesion metal layer 280. The adhesion metal layer 280 may be coupled to one or more die interconnect from the plurality of die interconnects 142. The metal layer 282 may be a first metal layer. The metal layer 282 is formed over and coupled to the adhesion metal layer 280. A deposition process (e.g., plating) may be used to form the metal layer 282. The metal layer 282 may include aluminum (Al) and/or copper (Cu). The metal layer 282 is formed through openings in the photoresist layer 500. Stage 3 also illustrates that the adhesion metal layer 280 and the metal layer 282 may also be formed over the photoresist layer 500.

Figure 5B:
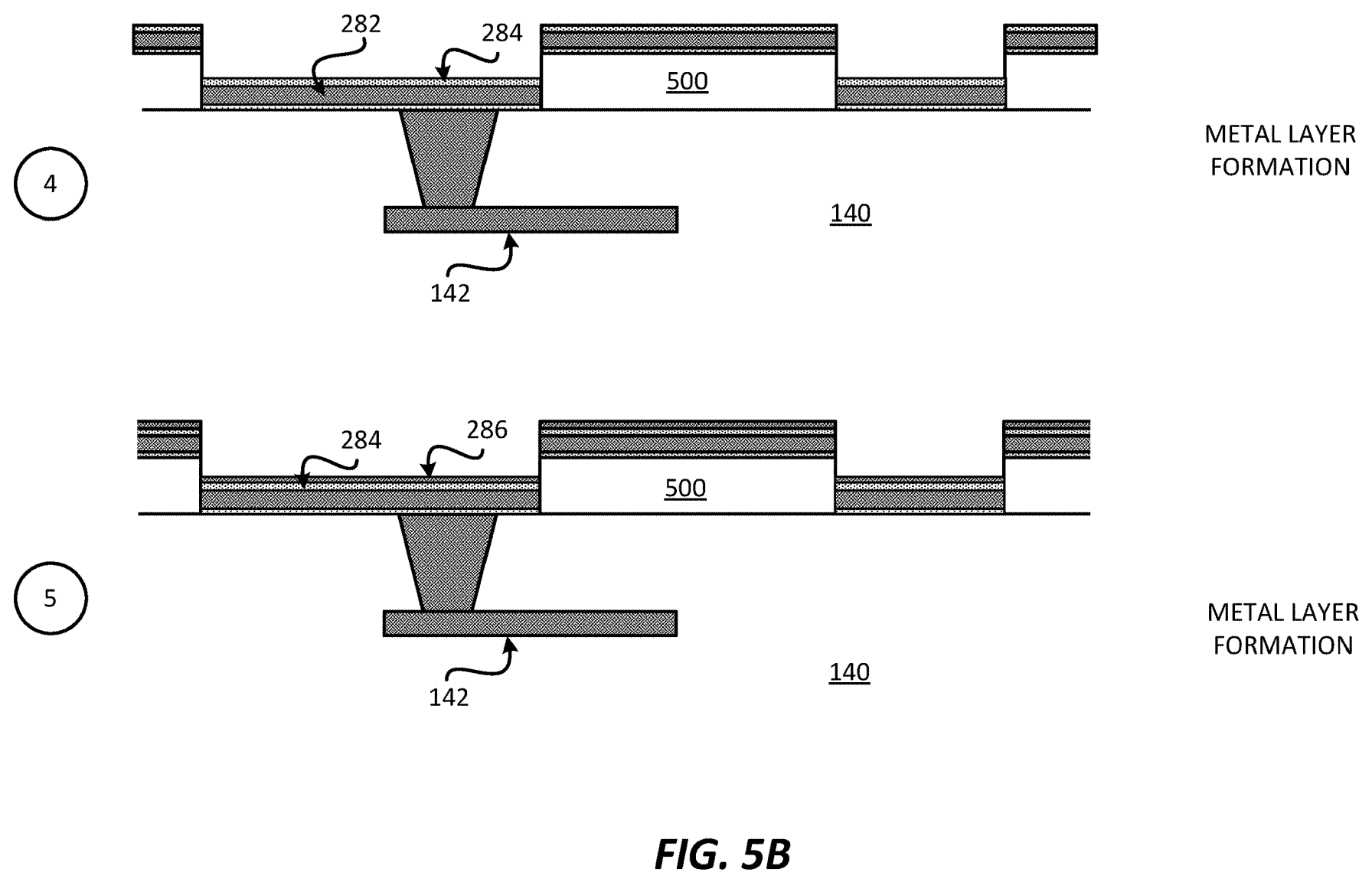

Stage 4, as shown in FIG. 5B, illustrates a state after the metal layer 284 is formed over the metal layer 282. The metal layer 284 is formed through openings in the photoresist layer 500. A deposition process (e.g., plating) may be used to form the metal layer 284. The metal layer 284 may be coupled to the metal layer 282. The metal layer 284 may include copper (Cu) and/or nickel (Ni). The metal layer 284 may be a second metal layer. Stage 4 also illustrates that the metal layer 284 may also be formed over the photoresist layer 500.

Stage 5 illustrates a state after the metal layer 286 is formed over the metal layer 284. The metal layer 286 is formed through openings in the photoresist layer 500. A deposition process (e.g., plating) may be used to form the metal layer 286. The metal layer 286 may be coupled to the metal layer 284. The metal layer 286 may include gold (Au). The metal layer 286 may be a third metal layer. Stage 5 also illustrates that the metal layer 286 may also be formed over the photoresist layer 500.

Figure 5C:
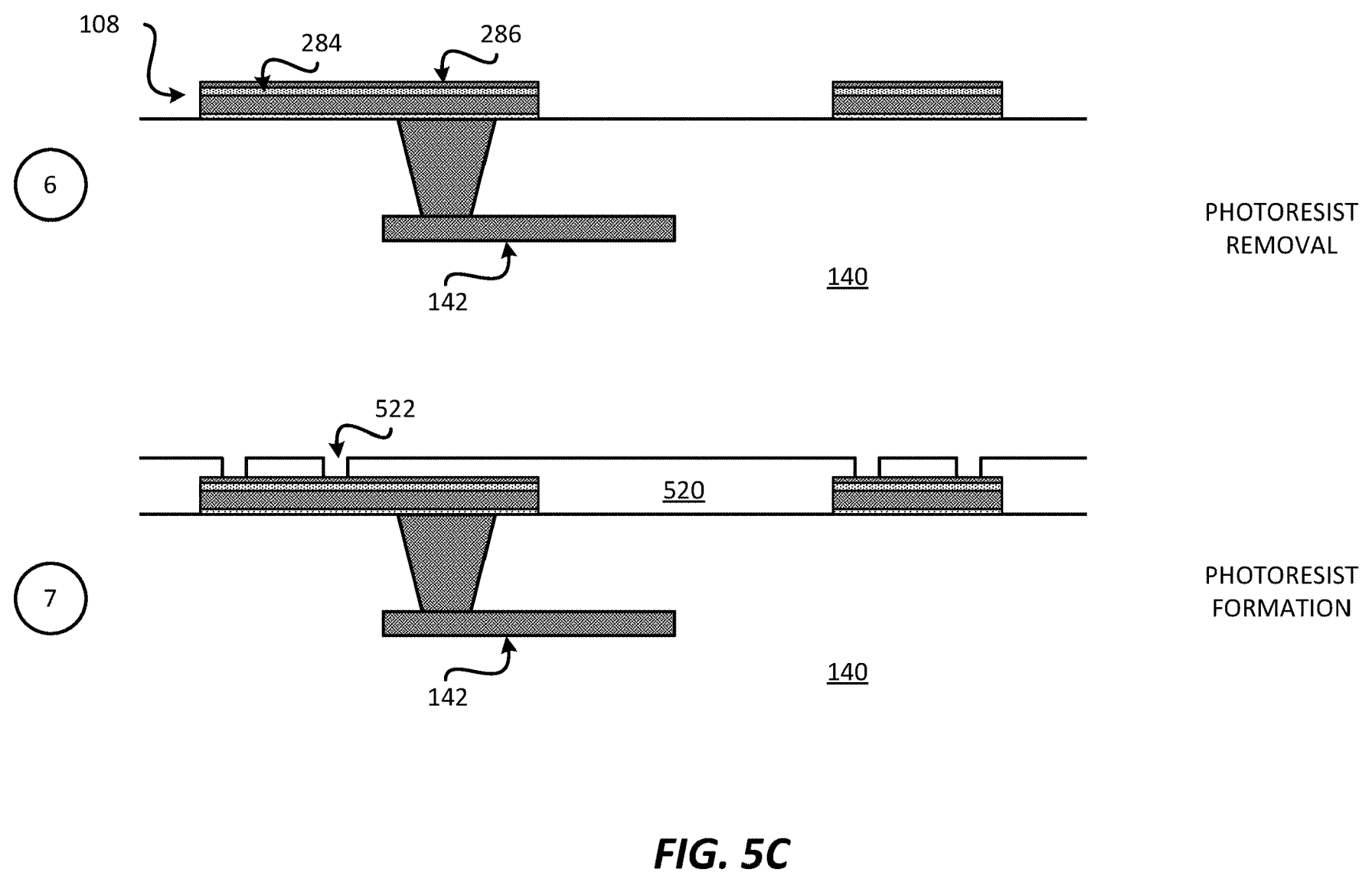

Stage 6, as shown in FIG. 5C, illustrates a state after the photoresist layer 500 is removed. A lift off process may be used to remove the photoresist layer 500 and any metal layer located over the photoresist layer 500.

Stage 7 illustrates a state after a photoresist layer 520 is formed over the die interconnection portion 104 and portions of the plurality of metallization interconnects 108. The photoresist layer 520 may include a plurality of openings 522. A deposition process may be used to form the photoresist layer 520. The photoresist layer 520 may be patterned to creating the plurality of openings 522 in the photoresist layer 520.

Figure 5D:

Stage 8, as shown in FIG. 5D, illustrates a state after portions of the metal layer 286 (e.g., third metal layer) are removed. An etching (e.g.; dry etching) process may be used to remove portions of the metal layer 286 that are exposed through the plurality of openings 522 in the photoresist layer 520.

Stage 9 illustrates a state after the photoresist layer 520 is removed. A resist strip process may be used to remove the photoresist layer 520.

Figure 5E:
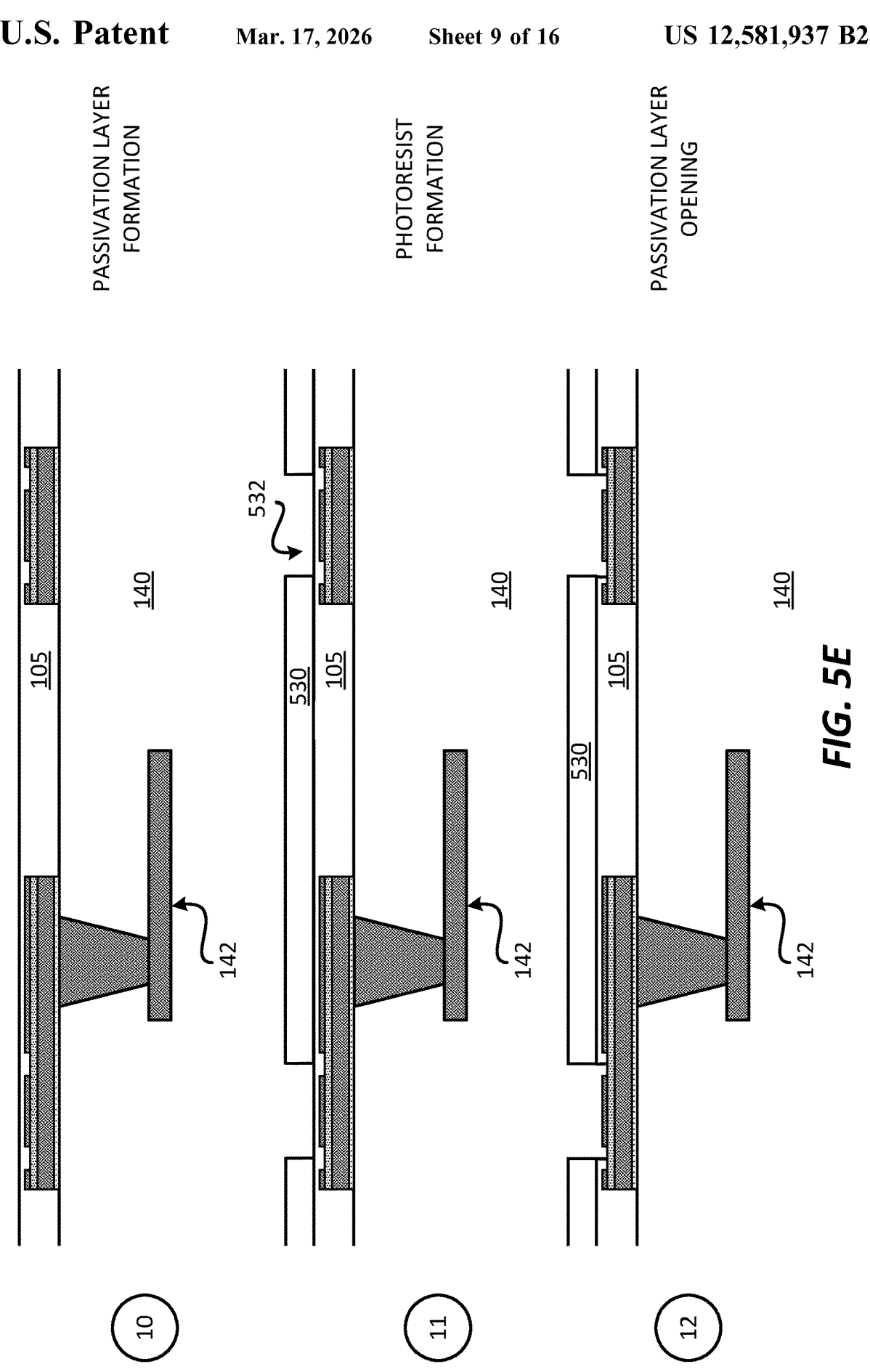

Stage 10, as shown in FIG. 5E, illustrates a state after a passivation layer 105 is formed over the die interconnection portion 104 and the plurality of metallization interconnects 108. A lamination process and/or a deposition process may be used to form the passivation layer 105. The passivation layer 105 may touch at least part of each metal layer that defines a metallization interconnect from the plurality of metallization interconnects 108. The passivation layer 105 may include silicon nitride (SiN).

Stage 11 illustrates a state after a photoresist layer 530 is formed over the die interconnection portion 104 and portions of the plurality of metallization interconnects 108. The photoresist layer 530 may include a plurality of openings 532. A patterning process may be used to form the plurality of openings 532 in the photoresist layer 530.

Stage 12 illustrates a state after portion of the passivation layer 105 are removed to form openings in the passivation layer 105. The openings in the passivation layer 105 may expose portions of the plurality of metallization interconnects 108. The openings in the passivation layer 105 are formed through the plurality of openings 532 in the photoresist layer 530.

Figure 5F:
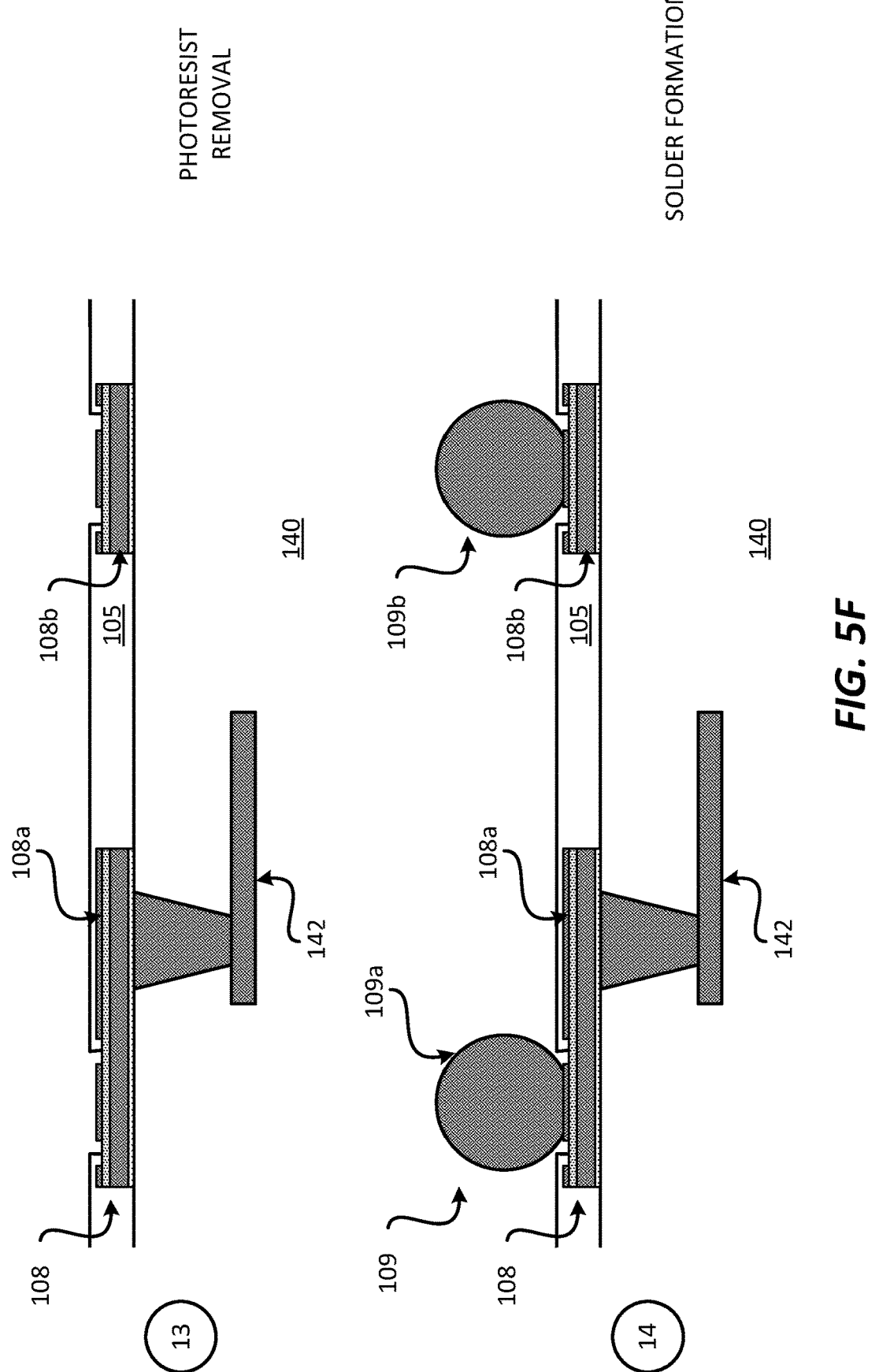

Stage 13, as shown in FIG. 5F, illustrates a state after the photoresist layer 530 is removed. A resist strip process may be used to remove the photoresist layer 530.

Stage 14 illustrates a state after a plurality of solder interconnects 109 are coupled to the plurality of metallization interconnects 108. A solder reflow process may be used to form and couple the plurality of solder interconnects 109 to the plurality of metallization interconnects 108. The solder interconnect 109a is coupled to the metallization interconnect 108a through an opening in the passivation layer 105. The solder interconnect 109b is coupled to the metallization interconnect 108b through another opening in the passivation layer 105.

Exemplary Flow Diagram of a Method for Fabricating an Integrated Device

Figure 6:
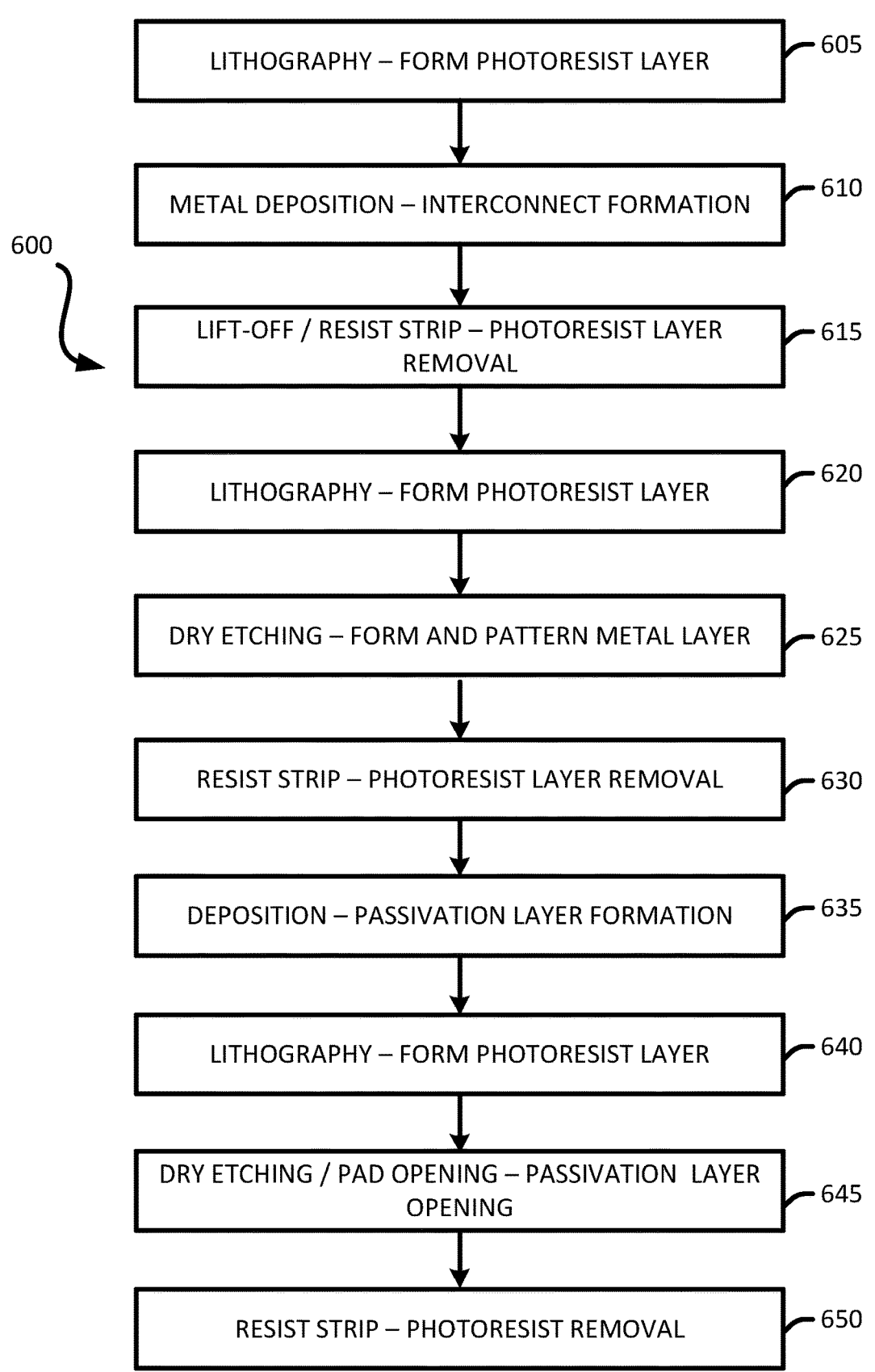
FIG. 6 illustrates an exemplary flow diagram of a method for fabricating an integrated device.

In some implementations, fabricating an integrated device includes several processes. FIG. 6 illustrates an exemplary flow diagram of a method 600 for providing or fabricating an integrated device. In some implementations, the method 600 of FIG. 6 may be used to provide or fabricate any of the integrated devices of the disclosure. For example, the method 600 of FIG. 6 may be used to fabricate the integrated device 100.

It should be noted that the method 600 of FIG. 6 may combine one or more processes in order to simplify and/or clarify the method for providing or fabricating an integrated device. In some implementations, the order of the processes may be changed or modified. In some implementations, one or more of processes may be replaced or substituted without departing from the scope of the disclosure. The method 600 of FIG. 6 may be used to fabricate one integrated device or several integrated devices at a time (as part of a wafer). The method 600 may be performed after a substrate portion (e.g., 102) and/or a die interconnection portion (e.g., 104) is provided and/or fabricated, as shown in FIG. 5A. The method 600 may also be used to fabricate the integrated device 300.

The method performs (at 605) a lithography process that includes forming a photoresist layer. Stage 2 of FIG. 5A, illustrates a state after a photoresist layer 500 is formed over the die interconnection portion 104. The photoresist layer 500 may be formed over the at least one dielectric layer 140 and/or the die interconnects 142. The photoresist layer 500 may include a plurality of openings. A patterning process may be used to form the plurality of openings in the photoresist layer 500. The photoresist layer may be a mask.

The method performs (at 610) one or more metal deposition processes. Stage 3 of FIG. 5A, illustrates a state after the adhesion metal layer 280 and the metal layer 282 are formed over the die interconnection portion 104. The adhesion metal layer 280 is formed through openings in the photoresist layer 500. The adhesion metal layer 280 may include titanium (Ti). A deposition process (e.g., plating) may be used to form the adhesion metal layer 280. The adhesion metal layer 280 may be coupled to one or more die interconnect from the plurality of die interconnects 142. The metal layer 282 may be a first metal layer. The metal layer 282 is formed over and coupled to the adhesion metal layer 280. A deposition process (e.g., plating) may be used to form the metal layer 282. The metal layer 282 may include aluminum (Al) and/or copper (Cu). The metal layer 282 is formed through openings in the photoresist layer 500.

Stage 4, as shown in FIG. 5B, illustrates a state after the metal layer 284 is formed over the metal layer 282. The metal layer 284 is formed through openings in the photoresist layer 500. A deposition process (e.g., plating) may be used to form the metal layer 284. The metal layer 284 may be coupled to the metal layer 282. The metal layer 284 may include copper (Cu) and/or nickel (Ni). The metal layer 284 may be a second metal layer.

Stage 5, as shown in FIG. 5B, illustrates a state after the metal layer 286 is formed over the metal layer 284. The metal layer 286 is formed through openings in the photoresist layer 500. A deposition process (e.g., plating) may be used to form the metal layer 286. The metal layer 286 may be coupled to the metal layer 284. The metal layer 286 may include gold (Au). The metal layer 286 may be a third metal layer.

The method performs (at 615) a photoresist layer removal process. Stage 6 of FIG. 5C, illustrates a state after the photoresist layer 500 is removed. A lift off process may be used to remove the photoresist layer 500 and any metal layer located over the photoresist layer 500. Stage 6 may illustrate a metallization interconnect 108a and a metallization interconnect 108b, where each metallization interconnect includes an adhesion metal layer, a first metal layer and a second metal layer. The metallization interconnect 108a may include an under bump metallization interconnect. The metallization interconnect 108b may include an under bump metallization interconnect.

The method performs (at 620) a lithography process that includes forming a photoresist layer. Stage 7 of FIG. 5C, illustrates a state after a photoresist layer 520 is formed over the die interconnection portion 104. The photoresist layer 520 may be formed over the at least one dielectric layer 140 and/or the die interconnects 142. The photoresist layer 520 may include a plurality of openings. A patterning process may be used to define openings in the photoresist layer 520.

The method patterns (at 625) a metal layer through a dry etching process. Stage 8 of FIG. 5D, illustrates a state after portions of the metal layer 286 (e.g., third metal layer) are removed. An etching (e.g.; dry etching) process may be used to remove portions of the metal layer 286 that are exposed through openings in the photoresist layer 520.

The method removes (at 630) the photoresist layer. Stage 9 of FIG. 5D, illustrates a state after the photoresist layer 520 is removed. A resist strip process may be used to remove the photoresist layer 520. Stage 9 may illustrate a metallization interconnect 108a and a metallization interconnect 108b, where each metallization interconnect includes an adhesion metal layer, a first metal layer, a second metal layer and a third metal layer. The metallization interconnect 108a may include an under bump metallization interconnect. The metallization interconnect 108b may include an under bump metallization interconnect.

The method forms (at 635) a passivation layer. Stage 10 of FIG. 5E, illustrates a state after a passivation layer 105 is formed over the die interconnection portion 104 and the plurality of metallization interconnects 108. A lamination process and/or a deposition process may be used to form the passivation layer 105. The passivation layer 105 may include silicon nitride (SiN). The passivation layer 105 may touch at least part of each metal layer that defines a metallization interconnect from the plurality of metallization interconnects 308.

The method performs (at 640) a lithography process that includes forming a photoresist layer. Stage 11 of FIG. 5E, illustrates a state after a photoresist layer 530 is formed over the die interconnection portion 104 and portions of the plurality of metallization interconnects 108. The photoresist layer 530 may include a plurality of openings. A patterning process may be used to define openings in the photoresist layer 530.

The method removes (at 645) portions of the passivation layer through a dry etching process. Stage 12 of FIG. 5E, illustrates a state after portion of the passivation layer 105 are removed to form openings in the passivation layer 105. The openings in the passivation layer 105 may expose portions of the plurality of metallization interconnects 108.

The method removes (at 650) the photoresist layer. Stage 13 of FIG. 5F, illustrates a state after the photoresist layer 530 is removed. A resist strip process may be used to remove the photoresist layer 530.

Exemplary Sequence for Fabricating an Integrated Device

Figure 7A:
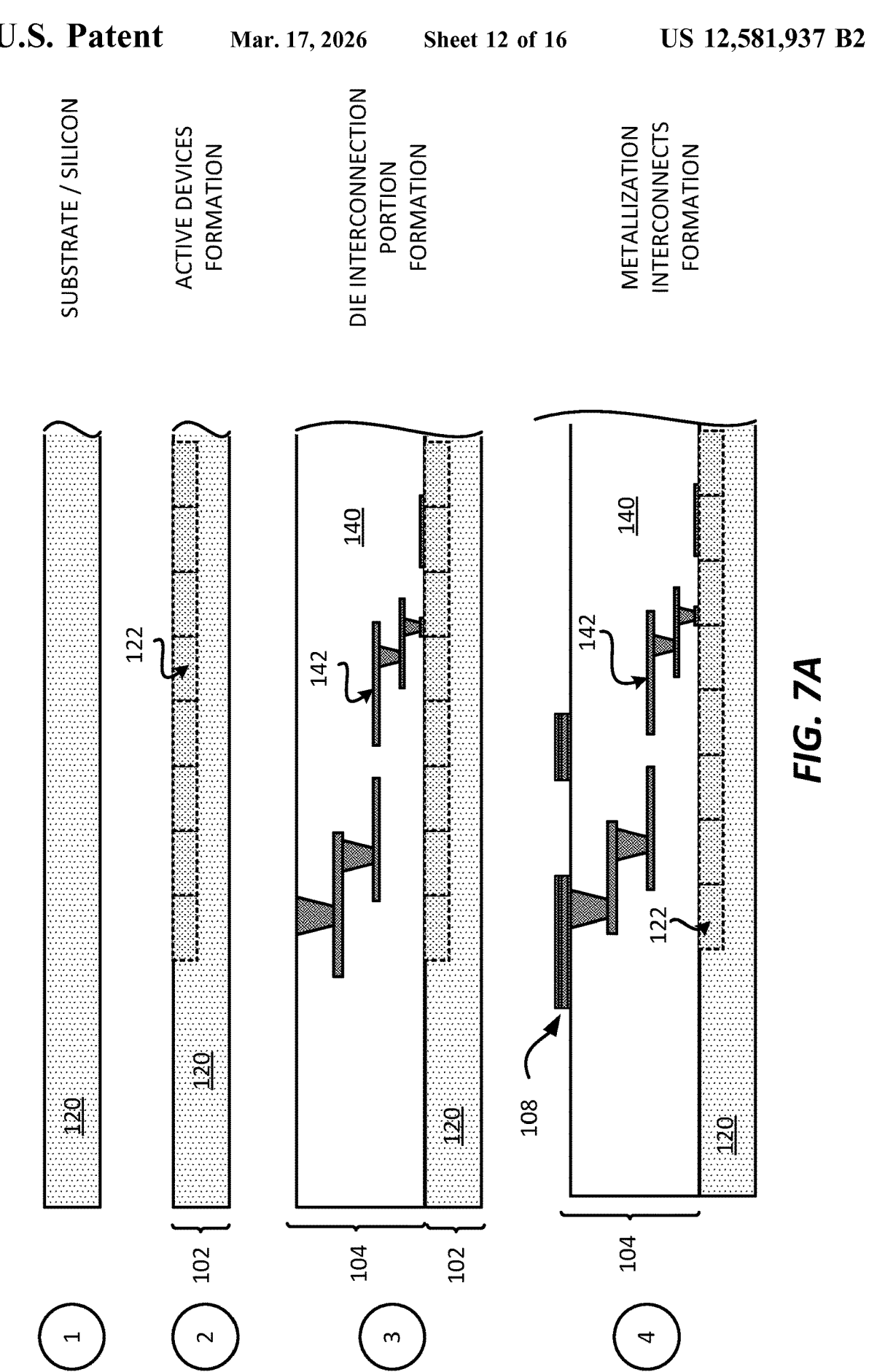
FIGS. 7A-7B illustrate an exemplary sequence for fabricating another integrated device.
Figure 7B:
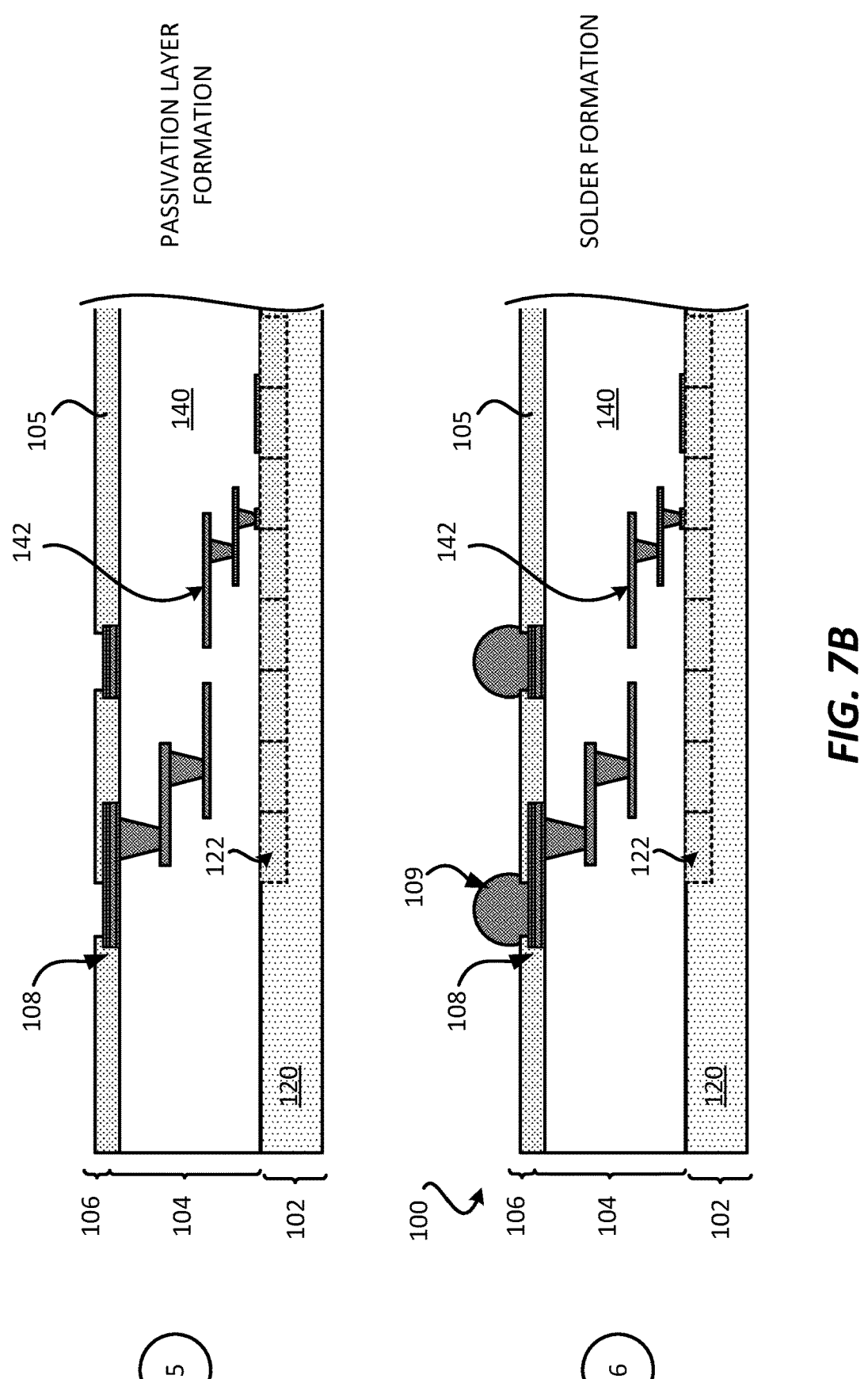

FIGS. 7A-7B illustrate an exemplary sequence for providing or fabricating an integrated device. In some implementations, the sequence of FIGS. 7A-7B may be used to provide or fabricate the integrated device 100 of FIG. 1, or any of the integrated devices described in the disclosure.

It should be noted that the sequence of FIGS. 7A-7B may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. The sequence of FIGS. 7A-7B may be used to fabricate one integrated device or several integrated devices at a time (as part of a wafer).

Stage 1, as shown in FIG. 7A, illustrates a state after a die substrate 120 is provided. The die substrate 120 may include silicon (Si). The die substrate 120 may be a wafer.

Stage 2 illustrates a state after components for a device level 122 are fabricated. As mentioned above, a device level 122 of a die substrate 120 may include a plurality of cells (e.g., logic cells) and/or transistors. In some implementations, a front end of line (FEOL) process may be used to fabricate the plurality of cells (e.g., logic cells) and/or transistors in and/or over the die substrate 120. The plurality of cells (e.g., logic cells) and/or a plurality of transistors (not shown) may be part of the device level 122 of the integrated device 100. Different implementations may use different types of transistors, such as a field effect transistor (FET), planar FET, finFET, and a gate all around FET. Stage 2 may illustrate a substrate portion 102 that includes the die substrate 120 and a device level 122.

Stage 3 illustrates a state a die interconnection portion 104 is formed over the substrate portion 102. The die interconnection portion 104 includes at least one dielectric layer 140 and a plurality of die interconnects 142. The plurality of die interconnects 142 may be coupled to the device level 122. In some implementations, a back end of line (BEOL) process may be used to fabricate the die interconnection portion 104.

Stage 4 illustrates a state after a plurality of metallization interconnects 108 are formed and coupled to the plurality of die interconnects 142. The plurality of metallization interconnects 108 may be fabricated using the process described in at least FIGS. 5A-5F.

Stage 5, as shown in FIG. 7B, illustrates a state after a passivation layer 105 is formed over the die interconnection portion 104 and portions of the plurality of metallization interconnects 108. The passivation layer 105 may include several openings. A lamination process and/or a deposition process may be used to form the passivation layer 105. The passivation layer 105 may touch at least part of each metal layer that defines a metallization interconnect from the plurality of metallization interconnects 108. Stage 5 may illustrate the integrated device 100 of FIG. 1.

Stage 6 illustrates a state after a plurality of solder interconnects 109 are coupled to the plurality of metallization interconnects 108. A solder reflow process may be used to form and couple the plurality of solder interconnects 109 to the plurality of metallization interconnects 108. The solder interconnect 109a is coupled to the metallization interconnect 108a through an opening in the passivation layer 105. The solder interconnect 109b is coupled to the metallization interconnect 108b through another opening in the passivation layer 105. Stage 6 may illustrate the integrated device 100 of FIG. 1.

Exemplary Sequence for Fabricating an Integrated Device

Figure 8:
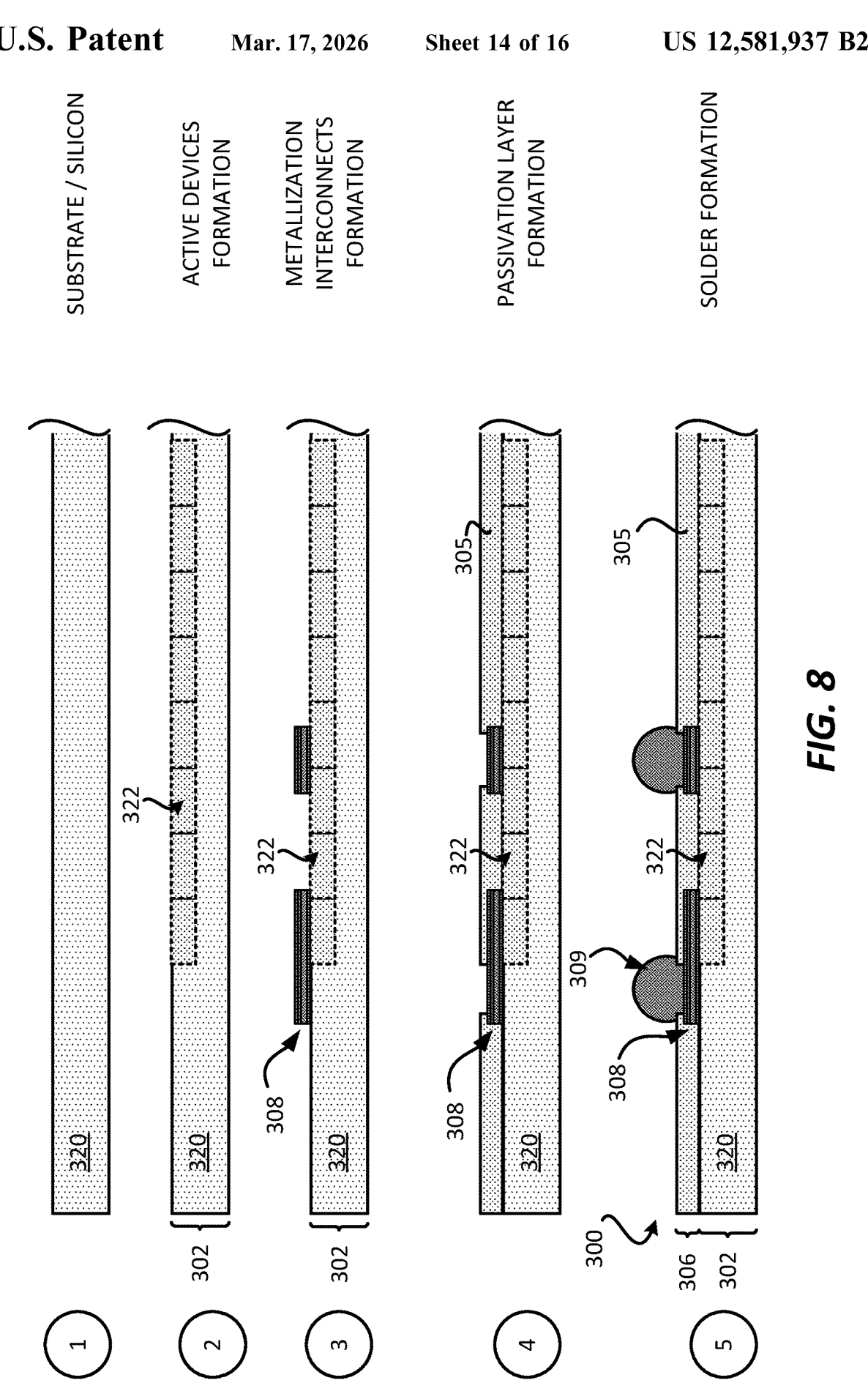
FIG. 8 illustrate an exemplary sequence for fabricating another integrated device.

FIG. 8 illustrates an exemplary sequence for providing or fabricating an integrated device. In some implementations, the sequence of FIG. 8 may be used to provide or fabricate the integrated device 300 of FIG. 3, or any of the integrated devices described in the disclosure.

It should be noted that the sequence of FIG. 8 may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. The sequence of FIG. 8 may be used to fabricate one integrated device or several integrated devices at a time (as part of a wafer).

Stage 1, as shown in FIG. 8, illustrates a state after a die substrate 320 is provided. The die substrate 320 may include silicon (Si). The die substrate 320 may be a wafer.

Stage 2 illustrates a state after components for a device level 322 are fabricated. As mentioned above, a device level 322 of a die substrate 320 may include a plurality of filters, a plurality of cells (e.g., logic cells) and/or transistors. In some implementations, a front end of line (FEOL) process may be used to fabricate the plurality of cells (e.g., logic cells) and/or transistors in and/or over the die substrate 320. The plurality of filters, the plurality of cells (e.g., logic cells) and/or a plurality of transistors (not shown) may be part of the device level 322 of the integrated device 300. Different implementations may use different types of transistors, such as a field effect transistor (FET), planar FET, finFET, and a gate all around FET. Stage 2 may illustrate a substrate portion 302 that includes the die substrate 320 and a device level 322.

Stage 3 illustrates a state after a plurality of metallization interconnects 308 are formed and coupled to the device level 322 in the die substrate 320. The plurality of metallization interconnects 308 may be fabricated using the process described in at least FIGS. 5A-5F.

Stage 4 illustrates a state after a passivation layer 305 is formed over the die interconnection portion 304 and portions of the plurality of metallization interconnects 308. The passivation layer 305 may include several openings. A lamination process and/or a deposition process may be used to form the passivation layer 305. The passivation layer 305 may touch at least part of each metal layer that defines a metallization interconnect from the plurality of metallization interconnects 308. Stage 4 may illustrate the integrated device 300 of FIG. 3.

Stage 5 illustrates a state after a plurality of solder interconnects 309 are coupled to the plurality of metallization interconnects 308. A solder reflow process may be used to form and couple the plurality of solder interconnects 309 to the plurality of metallization interconnects 308. The solder interconnect 309a is coupled to the metallization interconnect 308a through an opening in the passivation layer 305. The solder interconnect 309b is coupled to the metallization interconnect 308b through another opening in the passivation layer 305. Stage 5 may illustrate the integrated device 300 of FIG. 3.

Exemplary Flow Diagram of a Method for Fabricating an Integrated Device

In some implementations, fabricating an integrated device includes several processes. FIG. 9 illustrates an exemplary flow diagram of a method 900 for providing or fabricating an integrated device. In some implementations, the method 900 of FIG. 9 may be used to provide or fabricate any of the integrated devices of the disclosure. For example, the method 900 of FIG. 9 may be used to fabricate the integrated device 100 and/or the integrated device 300.

It should be noted that the method 900 of FIG. 9 may combine one or more processes in order to simplify and/or clarify the method for providing or fabricating an integrated device. In some implementations, the order of the processes may be changed or modified. In some implementations, one or more of processes may be replaced or substituted without departing from the scope of the disclosure. The method 900 of FIG. 9 may be used to fabricate one integrated device or several integrated devices at a time (as part of a wafer).

The method provides (at 905) a die substrate. Stage 1 of FIG. 7A, illustrates and describes an example of a die substrate 120 that is provided. The die substrate 120 may include a wafer. The die substrate 120 may include silicon. Stage 1 of FIG. 8, illustrates and describes an example of a die substrate 320 that is provided. The die substrate 320 may include a wafer. The die substrate 320 may include silicon.

The method forms (at 910) active devices (e.g., components in device level) in the and over the die substrate. Stage 2 of FIG. 7A, illustrates and describes an example of a plurality of active devices that are formed in and over the die substrate 120. Stage 2 of FIG. 8, illustrates and describes an example of a plurality of active devices that are formed in and over the die substrate 320. The active devices may be part of the device level (e.g., 122, 322) of an integrated device. The plurality of active devices may include a plurality of filters, a plurality of cells (e.g., logic cells) and/or a plurality of transistors (not shown) that may be formed in and/or over the die substrate (e.g., 120, 320). The plurality of filters, the plurality of cells (e.g., logic cells) and/or a plurality of transistors (not shown) may be part of the device level 122 of the integrated device 100. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 120.

The method optionally forms (at 915) a die interconnection portion that is coupled to the die substrate. Forming the die interconnection portion includes forming at least one dielectric layer and a plurality of die interconnects. Stage 3 of FIG. 7A, illustrates and describes an example of a die interconnection portion 104 is formed. The die interconnection portion 104 is located over and coupled to the die substrate 120. The die interconnection portion 104 may be coupled to the plurality of cells and/or transistors located in and/or over the die substrate 120. The die interconnection portion 104 (e.g., die interconnection portion) may include at least one dielectric layer 140 (e.g., die dielectric layer) and a plurality of die interconnects 142. The plurality of die interconnects 142 may be coupled to the plurality of cells and/or transistors. In some implementations, a back end of line (BEOL) process may be used to fabricate the die interconnection portion 104.

The method forms (at 920) a metallization portion. Forming the metallization portion may include forming a plurality of metallization interconnects (e.g., 108). Stage 4 of FIG. 7A, illustrates and describes an example of a plurality of metallization interconnects 108 that are formed over the die interconnection portion 104. A metallization interconnect from the plurality of metallization interconnects 108 may include an adhesion metal layer, a first metal layer, a second metal layer and a third metal layer. Examples of the adhesion metal layer, the first metal layer, the second metal layer and the third metal layer are described in at least FIGS. 5A-5F. The plurality of metallization interconnects 108 may be coupled to a die interconnect from the plurality of die interconnects 142. In some implementations, a plurality of metallization interconnects may be formed over the substrate portion. Stage 3 of FIG. 8, illustrates and describes an example of a plurality of metallization interconnects 308 that are formed over the die substrate 320. The plurality of metallization interconnects 308 may be coupled to the device level 322 of the die substrate 320.

The method forms (at 925) a passivation layer. Stage 5 of FIG. 7B, illustrates and describes an example of a passivation layer 105 that is formed. The passivation layer 105 may be a dielectric layer. The passivation layer 105 may include silicon nitride (SiN). A deposition and/or lamination process may be used to form the passivation layer 105. Stage 4 of FIG. 8, illustrates and describes an example of a passivation layer 305 that is formed. The passivation layer (e.g., 105, 305) may touch at least part of each metal layer that defines a metallization interconnect from the plurality of metallization interconnects (e.g., 108, 308).

The method couples (at 930) a plurality of solder interconnects to a metallization portion. Stage 6 of FIG. 7B, illustrates and describes an example of a plurality of solder interconnects 109 that are coupled to the plurality of metallization interconnects 108. Stage 5 of FIG. 8, illustrates and describes an example of a plurality of solder interconnects 309 that are coupled to the plurality of metallization interconnects 308. A solder reflow process may be used to form and couple the plurality of solder interconnects (e.g., 109, 309) to the plurality of metallization interconnects (e.g., 108, 308).

Exemplary Electronic Devices

Figure 10:
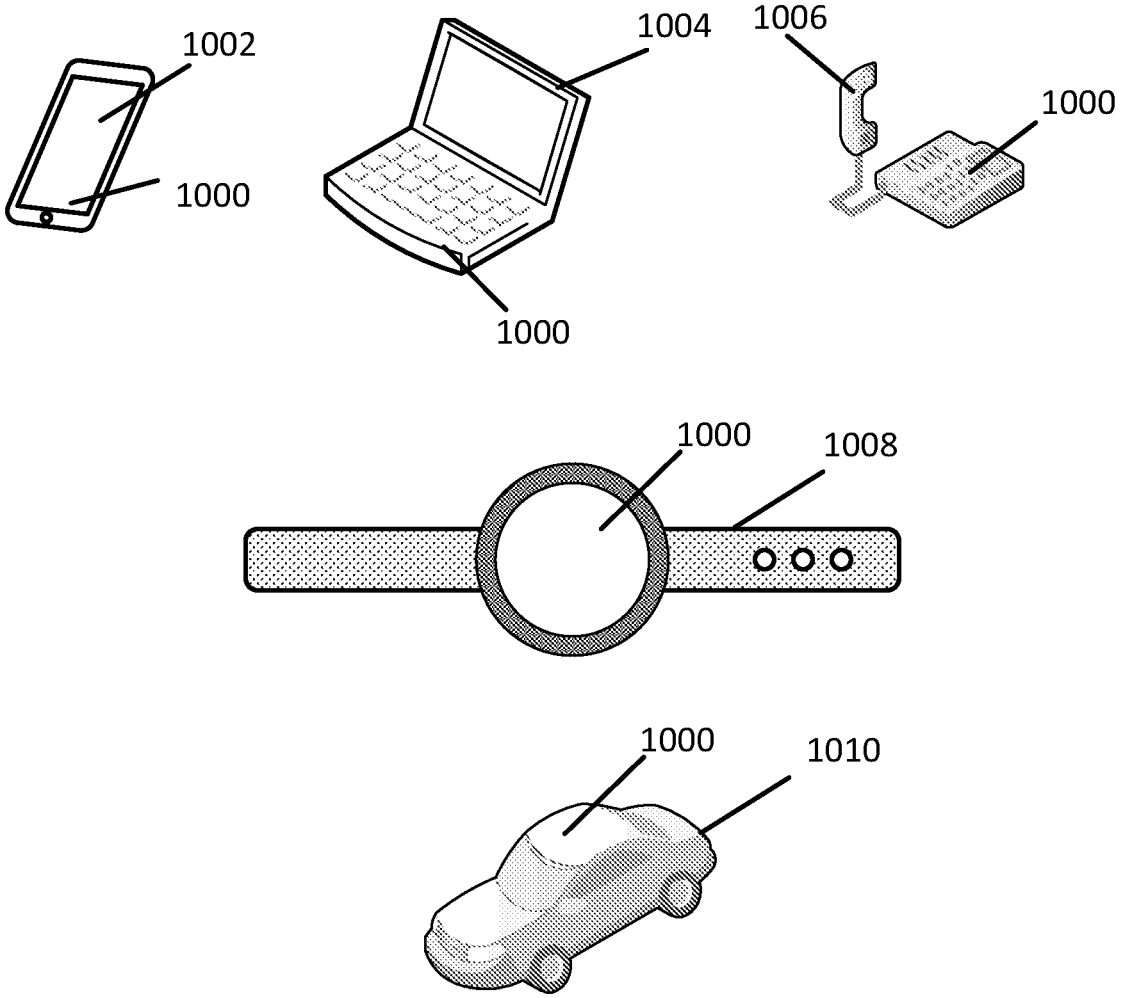
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5F, 6, 7A-7B and 8-10 may be rearranged and/or combined into a single component, process, feature or function or embodied in several components, processes, or functions. Additional elements, components, processes, and/or functions may also be added without departing from the disclosure. It should also be noted FIGS. 1-4, 5A-5F. 6, 7A-7B and 8-10 and its corresponding description in the present disclosure is not limited to dies and/or ICs. In some implementations, FIGS. 1-4, 5A-5F, 6, 7A-7B and 8-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: An integrated device comprising: a die substrate; a die interconnection portion coupled to the die substrate; and a metallization interconnect coupled to the die interconnection portion. The metallization interconnect comprises: an adhesion metal layer; a first metal layer coupled to the adhesion metal layer; a second metal layer coupled to the first metal layer; and a third metal layer coupled to the second metal layer.

Aspect 2: The integrated device of aspect 1, further comprising a solder interconnect coupled to the metallization interconnect.

Aspect 3: The integrated device of aspects 1 through 2, wherein the adhesion metal layer includes titanium (Ti).

Aspect 4: The integrated device of aspects 1 through 3, wherein the first metal layer includes aluminum (Al) and/or copper (Cu).

Aspect 5: The integrated device of aspects 1 through 4, wherein the second metal layer includes copper (Cu) and/or nickel (Ni).

Aspect 6: The integrated device of aspects 1 through 5, wherein the third metal layer includes gold (Au).

Aspect 7: The integrated device of aspect 6, further comprising a solder interconnect coupled to the third metal layer of the metallization interconnect.

Aspect 8: The integrated device of aspects 1 through 7, wherein the second metal layer is a wetting layer and/or a barrier layer, and wherein the third metal layer is a protection layer.

Aspect 9: The integrated device of aspects 1 through 8, further comprising a passivation layer located over a portion of the metallization interconnect, wherein the passivation layer includes an opening through which a solder interconnect is coupled to the metallization interconnect, wherein the passivation layer touches the adhesion metal layer, the first metal layer, the second metal layer and the third metal layer.

Aspect 10: The integrated device of aspects 1 through 9, wherein the metallization interconnect includes an under bump metallization (UBM) interconnect.

Aspect 11: An integrated device comprising: a die substrate; a metallization interconnect coupled to the die substrate. The metallization interconnect comprises: an adhesion metal layer; a first metal layer coupled to the adhesion metal layer; a second metal layer coupled to the first metal layer; and a third metal layer coupled to the second metal layer.

Aspect 12: The integrated device of aspect 11, further comprising a solder interconnect coupled to the metallization interconnect.

Aspect 13: The integrated device of aspects 11 through 12, wherein the adhesion metal layer includes titanium (Ti).

Aspect 14: The integrated device of aspects 11 through 13, wherein the first metal layer includes aluminum (Al) and/or copper (Cu).

Aspect 15: The integrated device of aspects 11 through 14, wherein the second metal layer includes copper (Cu) and/or nickel (Ni).

Aspect 16: The integrated device of aspects 11 through 15, wherein the third metal layer includes gold (Au).

Aspect 17: The integrated device of aspect 16, further comprising a solder interconnect coupled to the third metal layer of the metallization interconnect.

Aspect 18: The integrated device of aspects 11 through 17, wherein the second metal layer is a wetting layer and/or a barrier layer, and wherein the third metal layer is a protection layer.

Aspect 19: The integrated device of aspects 11 through 18, further comprising a passivation layer located over a portion of the metallization interconnect, wherein the passivation layer includes an opening through which a solder interconnect is coupled to the metallization interconnect, wherein the passivation layer touches the adhesion metal layer, the first metal layer, the second metal layer and the third metal layer, and wherein the metallization interconnect includes an under bump metallization (UBM) interconnect.

Aspect 20: The integrated device of aspects 11 through 19, wherein the integrated device is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating an integrated device. The method provides a die substrate. The method forms a metallization interconnect. The metallization interconnect comprises an adhesion metal layer; a first metal layer coupled to the adhesion metal layer; a second metal layer coupled to the first metal layer; and a third metal layer coupled to the second metal layer.

Aspect 22: The method of aspect 21, wherein forming the metallization interconnect comprises forming the metallization interconnect over the die substrate.

Aspect 23: The method of aspects 21 through 22, further comprising forming a die interconnection portion over the die substrate, wherein forming the metallization interconnect comprises forming the metallization interconnect over the die interconnection portion.

Aspect 24: The method of aspects 21 through 23, wherein the adhesion metal layer includes titanium (Ti), wherein the first metal layer includes aluminum (Al) and/or copper (Cu), wherein the second metal layer includes copper (Cu) and/or nickel (Ni), and wherein the third metal layer includes gold (Au).

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
a die substrate;
a die interconnection portion coupled to the die substrate; and
a metallization interconnect coupled to the die interconnection portion, wherein the metallization interconnect comprises:
an adhesion metal layer;
a first metal layer coupled to the adhesion metal layer;
a second metal layer coupled to the first metal layer; and
a third metal layer coupled to the second metal layer;
a passivation layer located over a portion of the metallization interconnect;
wherein the passivation layer includes an opening through which a solder interconnect is coupled to the metallization interconnect, and
wherein the passivation layer touches the adhesion metal layer, the first metal layer, the second metal layer and the third metal layer.

2. The integrated device of claim 1, further comprising a solder interconnect coupled to the metallization interconnect.

3. The integrated device of claim 1, wherein the adhesion metal layer includes titanium (Ti).

4. The integrated device of claim 1, wherein the first metal layer includes aluminum (Al) and/or copper (Cu).

5. The integrated device of claim 1, wherein the second metal layer includes copper (Cu) and/or nickel (Ni).

6. The integrated device of claim 1, wherein the third metal layer includes gold (Au).

7. The integrated device of claim 6, further comprising a solder interconnect coupled to the third metal layer of the metallization interconnect.

8. The integrated device of claim 1,
  wherein the second metal layer is a wetting layer and/or a barrier layer, and
  wherein the third metal layer is a protection layer.

9. The integrated device of claim 1, wherein the metallization interconnect includes an under bump metallization (UBM) interconnect.

10. An integrated device comprising:
  a die substrate; and
  a metallization interconnect coupled to the die substrate,
    wherein the metallization interconnect comprises:
    an adhesion metal layer;
    a first metal layer coupled to the adhesion metal layer;
    a second metal layer coupled to the first metal layer; and
    a third metal layer coupled to the second metal layer;
  a passivation layer located over a portion of the metallization interconnect,
  wherein the passivation layer includes an opening through which a solder interconnect is coupled to the metallization interconnect,
  wherein the passivation layer touches the adhesion metal layer, the first metal layer, the second metal layer and the third metal layer, and
  wherein the metallization interconnect includes an under bump metallization (UBM) interconnect.

11. The integrated device of claim 10, further comprising a solder interconnect coupled to the metallization interconnect.

12. The integrated device of claim 10, wherein the adhesion metal layer includes titanium (Ti).

13. The integrated device of claim 10, wherein the first metal layer includes aluminum (Al) and/or copper (Cu).

14. The integrated device of claim 10, wherein the second metal layer includes copper (Cu) and/or nickel (Ni).

15. The integrated device of claim 10, wherein the third metal layer includes gold (Au).

16. The integrated device of claim 15, further comprising a solder interconnect coupled to the third metal layer of the metallization interconnect.

17. The integrated device of claim 10,
  wherein the second metal layer is a wetting layer and/or a barrier layer, and
  wherein the third metal layer is a protection layer.

18. The integrated device of claim 10, wherein the integrated device is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. A method for fabricating an integrated device, comprising:
  providing a die substrate; and
  forming a metallization interconnect, wherein the metallization interconnect comprises:
    an adhesion metal layer;
    a first metal layer coupled to the adhesion metal layer;
    a second metal layer coupled to the first metal layer; and
    a third metal layer coupled to the second metal layer;
  forming a passivation layer over a portion of the metallization interconnect;
  wherein the passivation layer includes an opening through which a solder interconnect is coupled to the metallization interconnect, and
  wherein the passivation layer touches the adhesion metal layer, the first metal layer, the second metal layer and the third metal layer.

20. The method of claim 19, wherein forming the metallization interconnect comprises forming the metallization interconnect over the die substrate.

21. The method of claim 19, further comprising forming a die interconnection portion over the die substrate, wherein forming the metallization interconnect comprises forming the metallization interconnect over the die interconnection portion.

22. The method of claim 19,
  wherein the adhesion metal layer includes titanium (Ti),
  wherein the first metal layer includes aluminum (Al) and/or copper (Cu),
  wherein the second metal layer includes copper (Cu) and/or nickel (Ni), and
  wherein the third metal layer includes gold (Au).

* * * * *